(12) United States Patent
Duvvury et al.

(10) Patent No.: US 6,365,940 B1
(45) Date of Patent: Apr. 2, 2002

(54) HIGH VOLTAGE TRIGGER REMOTE-CATHODE SCR

(75) Inventors: Charvaka Duvvury, Plano; Roy Clifton Jones, III, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/697,942

(22) Filed: Oct. 26, 2000

Related U.S. Application Data

(60) Provisional application No. 60/171,345, filed on Dec. 21, 1999.

(51) Int. Cl.[7] .................................................. H01L 23/62
(52) U.S. Cl. ........................ 257/356; 257/355; 257/357; 257/362; 257/363
(58) Field of Search ................................ 257/356, 357, 257/355, 362, 363

(56) References Cited

U.S. PATENT DOCUMENTS

| | | | | |
|---|---|---|---|---|
| 5,012,317 A | * | 4/1991 | Rountre | 357/38 |
| 5,225,702 A | * | 7/1993 | Chatterjee | 257/360 |
| 5,502,317 A | * | 3/1996 | Duvvury | 257/107 |
| 5,517,051 A | * | 5/1996 | Chatterjee | 257/360 |
| 5,604,369 A | * | 2/1997 | Duvvury et al. | 257/360 |
| 5,869,873 A | * | 2/1999 | Yu | 257/362 |
| 5,903,032 A | * | 5/1999 | Duvvury | 257/356 |
| 5,907,462 A | * | 5/1999 | Chatterjee et al. | 361/56 |
| 5,925,922 A | * | 7/1999 | Rountree et al. | 257/536 |
| 5,977,596 A | * | 11/1999 | Rountree et al. | 257/363 |

* cited by examiner

*Primary Examiner*—Michael S. Lebentritt
*Assistant Examiner*—Douglas Menz
(74) *Attorney, Agent, or Firm*—Jacqueline J. Garner; W. James Brady, III; Frederick J. Telecky, Jr.

(57) ABSTRACT

A tunable high voltage trigger silicon controlled rectifier (SCR) with a high holding voltage is disclosed. The source of a drain extended MOS serves as the remote cathode for the SCR, while the drain of the drain extended MOS serves to generate avalanche currents to trigger the SCR.

16 Claims, 3 Drawing Sheets

HIGH VOLTAGE TRIGGER REMOTE-CATHODE SCR

This application claims priority under 35 USC §119(e)(1) of provisional application No. 60/171,345 filed Dec. 21, 1999.

TECHNICAL FIELD OF THE INVENTION

This invention relates generally to the field of power devices, and more particularly to ESD protection in power devices.

BACKGROUND OF THE INVENTION

Current technology trends continue to focus on high performance CMOS (complementary metal-oxide-semiconductor) and a new arena of VLSI (very-large-scale integration) called Smart Power chips. Smart Power chips are built with both low and high voltage CMOS. Power transistors on these Smart Power chips typically allow operating voltages up to 40 volts. The thrust of current research focuses on improving the transistor performance.

Smart Power chips are widely used in the automotive industry. The automotive environment is harsh and requires relatively high levels of protection against ESD and other types of transients. However, power transistors are generally weak for ESD due to their inherent device structure. Good ESD performance actually requires low power dissipation capability under high currents. This is inherent in optimized nMOS transistor structures, but not in power transistors due to the fact that the holding voltages are quite high. A high holding voltage increases the relative power dissipation under an ESD event and results in a low self-protection level.

An example of a heretofore known DEnMOS power transistor is shown in FIG. 1. The DEnMOS is built in a p-tank 112 located in a p-type epitaxial substrate 110. The drain contact region 116 is formed in a n-well drain 114. The source 118 is formed directly in the p-tank 112. The gate 120 is located partially over the p-tank and partially over a field oxide region 122 that is located between the drain 116 and the source 118. A 500 Å gate oxide 122 is located between the gate 120 and the p-tank 112. Typically channel lengths (between the source 118 edge and the n-well 114 edge) are 3–4 μm. Smaller than 3 μm channel lengths are not used because the breakdown voltage ($BVd_{ss}$) would be lowered for high voltage applications. Under high voltage conditions, the gate oxide region 122 does not breakdown since part of the voltage is supported by the depletion in the n-well 114.

Proper ESD protection suitable for high voltage applications is often difficult to achieve. SCR's with high trigger voltage ranges can be designed but they are unacceptable for high voltage pins where a load dump (i.e., a transient voltage much greater than the maximum operating voltage of the system) is a threat in the automotive environment.

SUMMARY OF THE INVENTION

Accordingly, a need has arisen in the art for improved ESD protection devices. The present invention provides a high voltage ESD protection device that substantially reduces or eliminates damage associated with ESD for high voltage applications.

In accordance with the present invention, a high voltage ESD protection device comprises a drain extended MOS transistor (DEnMOS) located in a tank region of a first conductivity type, a silicon controlled rectifier (SCR) merged with the DEnMOS into the tank region, and a resistor merged with the DEnMOS into the tank region. Different embodiments of the device can be provided where the first and second conductivity types are alternatively either p-type or n-type.

The DEnMOS transistor can include a first well region of a second conductivity type opposite the first conductivity type located in the tank, a drain of the second conductivity type located in the first well region, a source region of the second conductivity type located in the tank, a field oxide region in the tank separating the source from the first well, and a gate extending at least partially over the field oxide region. The gate and the source can be electrically connected to a ground potential.

The SCR can include a second well region of the second conductivity type located in the tank region, and an anode region of the first conductivity type also located in the second well region. The anode region can be electrically connected to a pad for providing ESD protection. In addition, an optional SCR diffusion region can be located within the second well region to provide latchup immunity. The SCR diffusion region can be of the same conductivity type as the second well region, and would be electrically connected to the anode.

The resistor can include a third well region of the second conductivity type and is also located in the tank region. Within the third well region, the resistor includes two resistor diffusion regions, one of which is electrically connected to the drain and the other electrically connected to the pad.

Other technical advantages of the present invention will be readily apparent to one skilled in the art from the following figures, descriptions, and claims.

BRIEF DESCRIPTION OF THE DRAWINGS

For a more complete understanding of the present invention and the advantages thereof, reference is made to the following description taken in conjunction with the accompanying drawings, wherein like reference numerals represent like parts, in which.

DETAILED DESCRIPTION OF THE INVENTION

The preferred embodiments of the present invention and its advantages are best understood by reference in more detail to the drawings.

This invention includes a high voltage ESD protection device having a Silicon Controlled Rectifier (SCR) that uses a drain extended NMOS (DEnMOS) as a trigger and a remote cathode to achieve a high holding voltage. While an n-type MOS is generally described herein, the invention may be practiced as a p-type variety.

Figure 1:
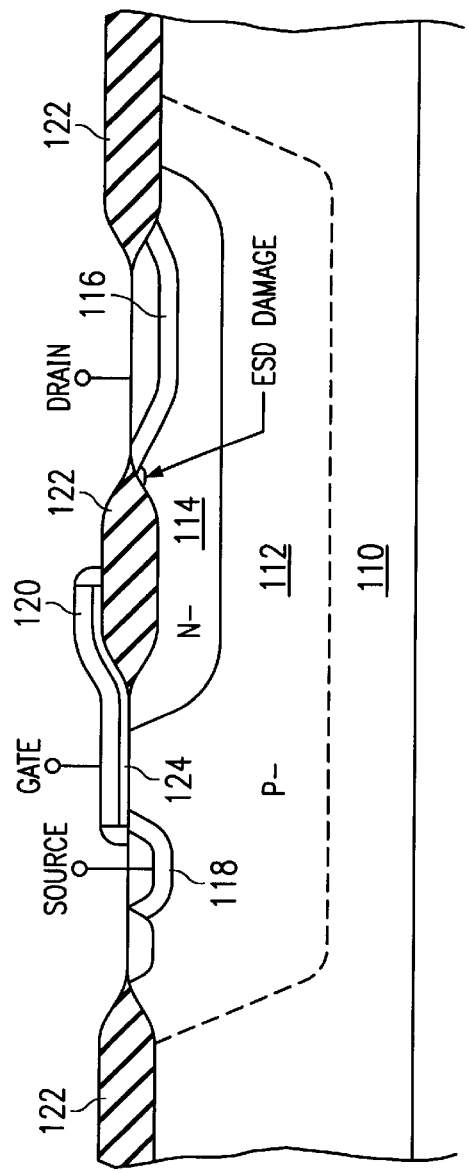
FIG. 1 is a cross-sectional view of a prior art DEnMOS transistor.
Figure 2:
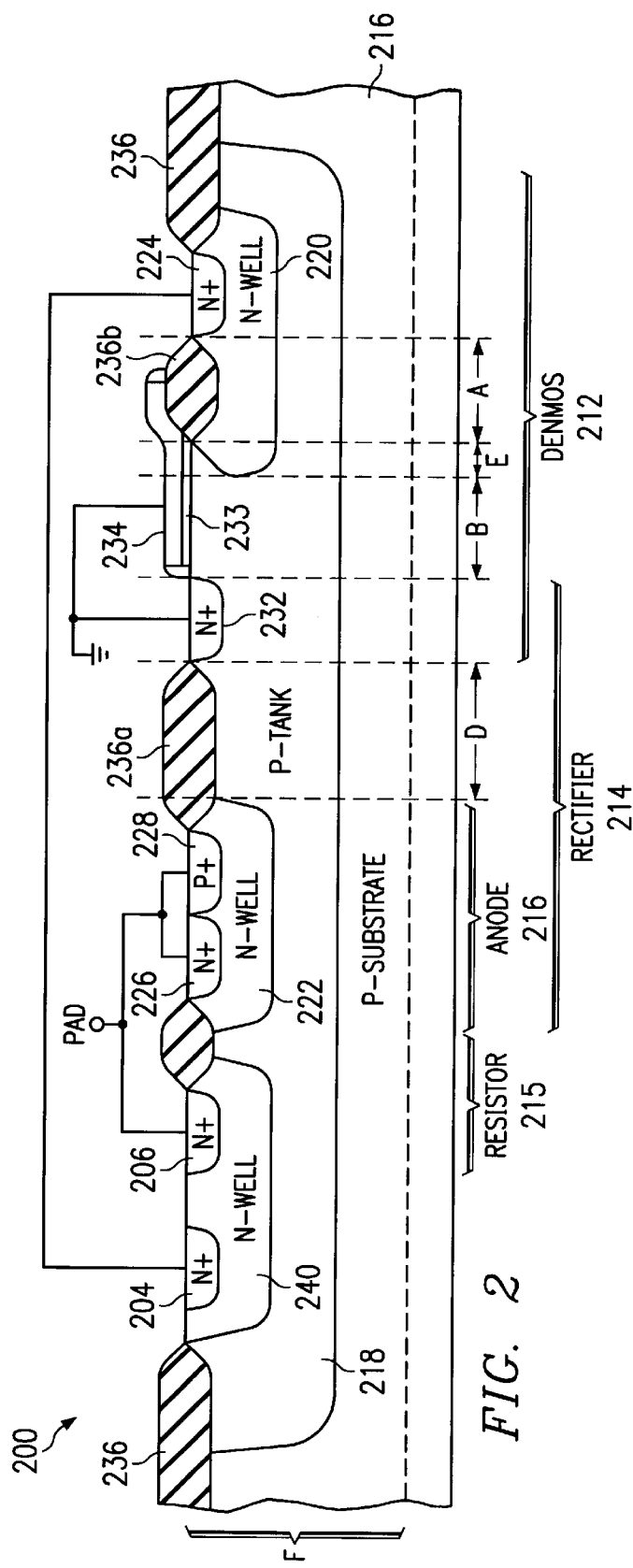
FIG. 2 is a cross-sectional view of an embodiment of a DEnMOS ESD protection device according to the invention.

An embodiment of a high voltage EDS protection device 200 having built-in ESD robustness according to the invention is illustrated in FIG. 2. The device 200 comprises a Silicon-Controlled Rectifier (SCR) 214 merged into a DEnMOS 212. A SCR is a device having four alternate layers of n and p type silicon which function as a current controlled switch. A SCR normally acts as an open circuit but switches rapidly to a conducting state when an appropriate signal (such as an ESD event) is applied to a conductor or conductive pad.

As illustrated in FIG. 2, an embodiment of the device 200 includes a tank region of a first conductivity type, which can be a p-tank 218, and is formed on a substrate which can be a p-type substrate 216. Within the tank, the device 200 includes a SCR 214 formed in a n-well 222, a DEnMOS 212 with a source diffusion region 232 which is shared with the SCR 214 and which forms the remote cathode of the SCR 214, and a resistor 215 formed in a separate n-well 240.

In addition to the remote cathode 232, the SCR 214 includes an anode 228, a p-type diffused region, and an n+ diffused region 226 in the n-well 222. The pnpn junctions of the SCR 214 are thus formed by the anode 228, n-well 222, p-tank 218 and cathode 232, respectively. The SCR can also include an n+ diffused region 226 in n-well 222. The n+ diffused region 226 provides an n+ contact to the n-well 222 on the anode side of the SCR 214, and prevents the triggering of the inherent vertical pnp for latchup immunity. Both diffusion region 226 and anode 228 are electrically connected to the pad.

In addition to having an n+ source diffusion 232 formed directly on the p-tank 218, the DEnMOS 212 has a n-type diffused region 224 for a drain which is located within an n-well 220. In addition, DEnMOS 212 can include a channel region 233, gate 234, and field oxide region 236b. DEnMOS gate 234, which can be of polysilicon, can extend partially over field oxide region 236b, and optionally over channel region 233. Gate 234 is electrically connected with the n+ source diffusion 232 and to a ground potential. The optional placement of gate 234 over field oxide region 236b is to adjust for variations in breakdown voltages and/or further ensure the margin between the SCR trigger and the DEnMOS drain 224 avalanche.

Resistor 215 has two n+ diffusion regions 204, 206 in an n-well 240. The first resistor diffusion region 204 can be electrically connected to the n-type diffused region 224 of the DEnMOS 212. The second resistor diffusion region 206, as well as the n+ diffused region 226 and anode 228 of SCR 214, can be electrically connected to the pad.

Field oxide regions 236 can be included to separate device 200 from other devices (not shown). In addition, field oxide regions 236 may provide separations between the anode 228 of SCR 214, the cathode 232, the drain 224 of DEnMOS 212, and the channel region 233.

N-wells 220 and 222 may be designed as high voltage. The term high voltage refers to a breakdown voltage across the n-well/p-tank junction of greater than 40 V. For a typical high voltage process, each n-tank could be either a low voltage n-tank (LVN) or a high voltage n-tank (HVN). The main difference between an LNV tank and an HVN tank is that the tanks are designed with such doping and depth differences so as to lead to higher breakdowns and consequently higher trigger voltages for the SCR. Typically, an HVN tank is 8.0 $\mu$m deep with a sheet resistance of about 2100 ohms/cm. An LVN tank can be designed sufficiently deep and of a doping to support the required drain. Typically, an LVN tank is 3.0 $\mu$m deep with a sheet resistance of about 1200 ohms/cm. A p-type epitaxial substrate may typically be from 8 $\mu$m to 11 $\mu$m deep with a sheet resistance of about 14–20 ohms/cm. LVN is normally used for the 5 V CMOS and HVN can be used for building power DMOS transistors.

The breakdown voltage of the drain 224 is determined by the n-well 220/p-tank 218 junction. For this reason, a high voltage n-well is used for n-well 220. The n-well 240 could either be the low voltage n-tank or a high voltage n-tank. The resistor 215 and the SCR 214 can also be built with LVN or HVN while the DEnMOS 212 is built in LVN. It should be noted again that the n-well 222 could be low voltage n-well (LVN) or high voltage n-well (HVN) for n-well 222. A LVN will make the SCR trigger more consistent by reducing the SCR trigger voltage.

Spacing A, the width of field oxide region 236b which is illustrated in FIG. 2, provides field isolation of n+ drain of DEnMOS and can be 2 $\mu$m. Spacing B is related to the length of channel 233. Varying spacing B controls transit time and to a limited degree, breakdown voltage. Spacing C controls the trigger voltage of the SCR. Spacing C can be greater than 2 $\mu$m to avoid leakage at the pad, but is preferably 3–8 $\mu$m. Spacing D is the spacing between the anode and the remote cathode of the SCR and can influence the trigger voltage and the holding voltage. If spacing D is made twice as large as the depth of the relatively low resistance region of the epitaxial layer, illustrated as spacing F in FIG. 2, generally 10–12 $\mu$m, the holding voltage can be increased to greater than 12 V and thus suitable for use with car batteries. Preferably, however, spacing D is about 40 $\mu$m. Spacing E provides an extension of the n-well 220 in the region of thin oxide 232. Spacing E can have strong influence on the trigger voltage since it essentially determines the drain breakdown voltage ($BV_{DSS}$) of the DEnMOS 212. Spacing E is can be varied from 1 to 2 $\mu$m.

With an ESD pulse event, the avalanche of the drain DEnMOS 212 injects carriers into the substrate. The DenMOS goes into high injection mode when the lateral npn formed by the DEnMOS 212 is in the snapback holding mode. Meanwhile, the n-well resistor 215 serves to limit ESD current into the weak DEnMOS in the snapback holding mode. In addition, the n-well resistor 215 also allows building of voltage at the pad to trigger the SCR at the designed voltage level, as controlled by spacings C and D. The sharing of n+ source diffusion 232 of the DEnMOS by the cathode of the SCR 214 allows the carriers injected by the DEnMOS to trigger the lateral SCR but not as a vertical pnp. Furthermore, providing a spacing D longer than the thickness of the epitaxial layer results in a high holding voltage.

Figure 3:
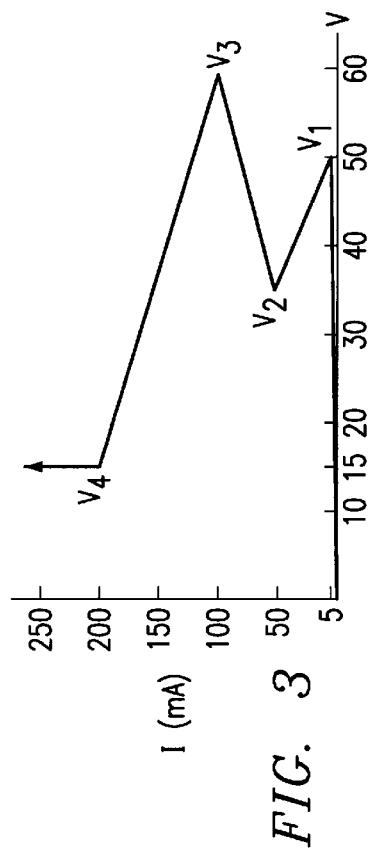
FIG. 3 is a graph of I–V characteristics for an embodiment of a DEnMOS ESD protection device as shown in FIG. 2.

A typical I–V relationship for an embodiment of the invention is illustrated in FIG. 3. At about 5 mA, the DEnMOS triggers at 50 ($V_1$). As the current is increased to 50 mA, the device snaps back and the DEnMOS holds at 35 ($V_2$). Thereafter when the current rises to 100 mA the N-tank 240 acts as a resistor 215 until the SCR triggers at a high voltage of 60 ($V_3$). Thereafter, the current may rise, but the voltage falls to 15 ($V_4$) at the holding current of the SCR. An SCR according to the invention can be designed to trigger at a higher voltage (80–100V). In an alternative embodiment, the SCR is built in HVN. In addition the resistor can be in HVN to allow proper building of the voltage.

Figure 4:
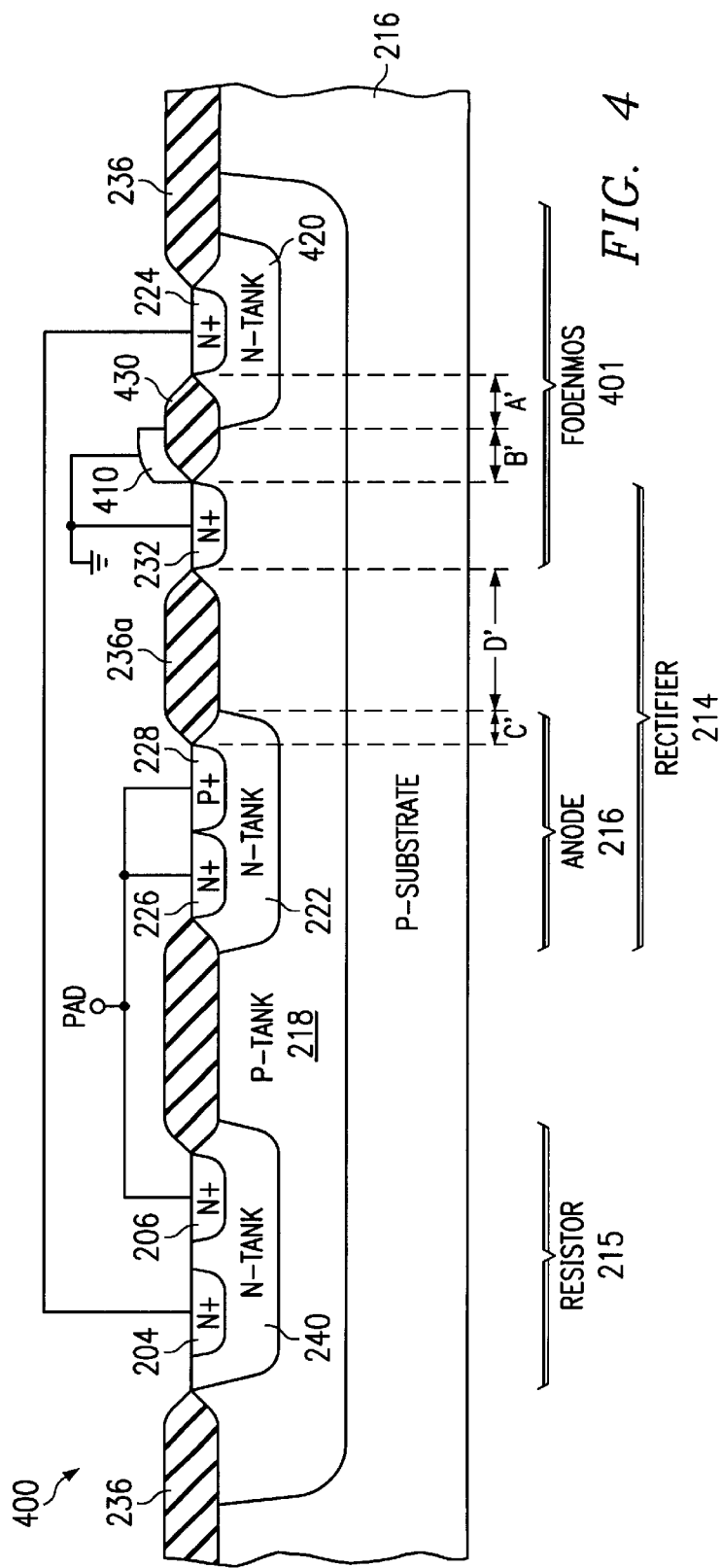
FIG. 4 is a cross-sectional view of an embodiment of a FODEnMOS ESD protection device according to the invention.

An alternative embodiment of the invention can be a design which permits more tunable conditions and/or for improved ESD performance, the trigger DEnMOS can be converted into a field oxide DEnMOS or a FODEnMOS. A FODEnMOS 401 triggering device according to the invention is shown in FIG. 4. As mentioned above, FODEnMOS 401 has a n+ source diffusion 232 and n-type diffused region 224 for a drain in an n-well 420. In addition, the FODEn-MOS 401 can include a gate 410 extending partially over a field oxide region 430. Referring to FIG. 4, spacing A' is can be 2 $\mu$m. Spacing B', which controls the trigger voltage, can be between 2–5 $\mu$m. Spacings C' and D' are same as described earlier for the DEnMOS 212. Dimensions for the devices are approximately 100 $\mu$m width for the resistor 215, 100 $\mu$m width for the DEnMOS 212, 100 $\mu$m width for the FODEnMOS 401, and 100 $\mu$m width for the SCR anode 216.

Figure 5:
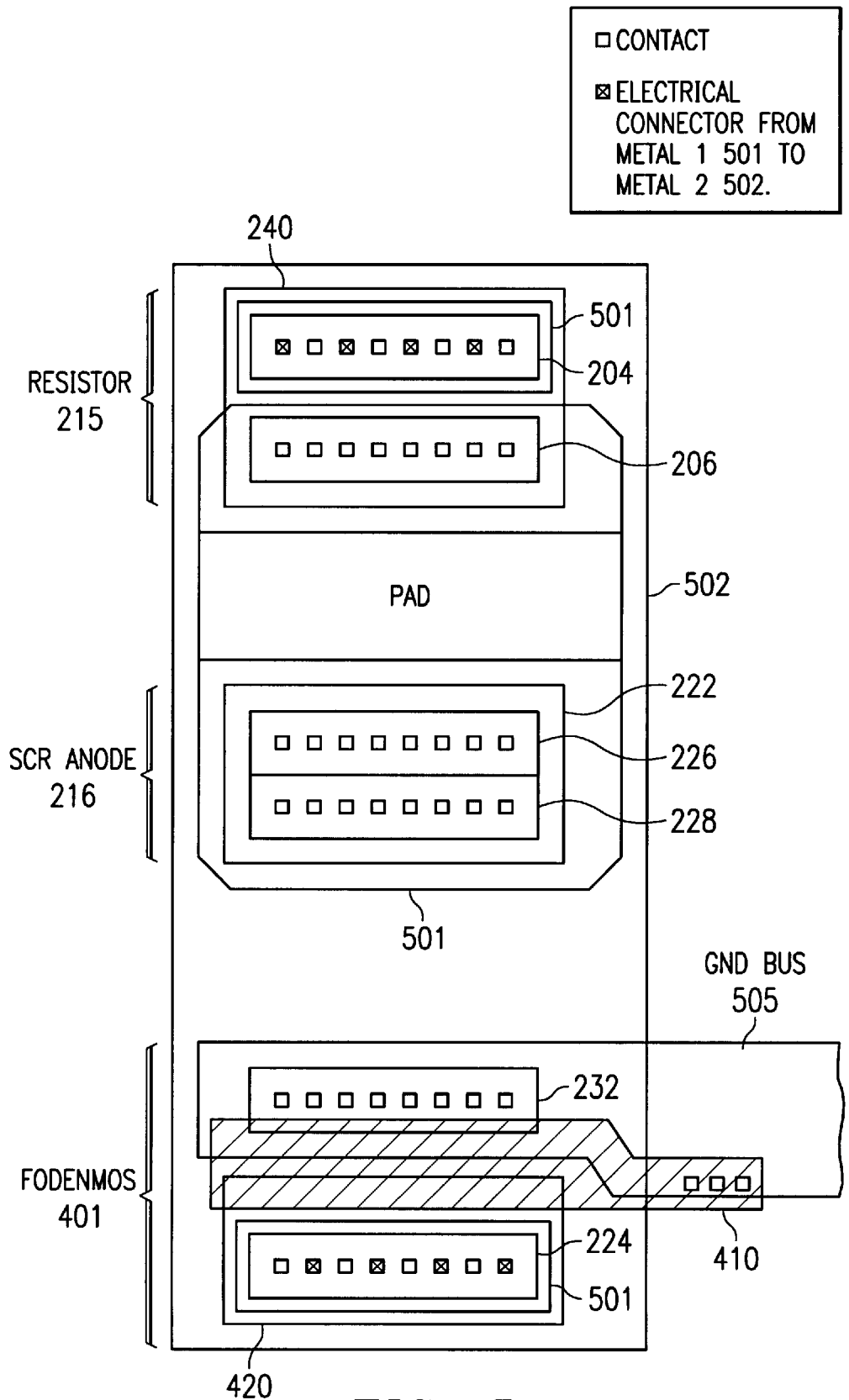
FIG. 5 is a layout of the ESD protection device shown in FIG. 4.

A suggested layout for the FODEnMOS 401 described above and in FIG. 4 is illustrated in FIG. 5. As part of the fabrication, process metal layers 501 and 502 can be used to provide electrical communication among the elements of the device. The metal layers 501, 502 can be separated by a non-conducting layer according to conventional means. A section of first metal layer 501 can be used to provide electrical connection of n+ diffused regions 206, 226 and p+ diffused region 228 to the pad. In addition, a second metal layer 502 can be used to make electrical communication between n+ diffused region 204 of the resistor and the FODEnMOS n-type diffused region 224 by providing electrical connectors which protrude from the second metal layer 502 through the non-conducting layer to the first metal layer 501 which can be in electrical communication with n+ diffused regions 204 and 224. In addition, a ground bus 505, which can be a third metal layer or other suitable electrical connector, can be used to provide electrical connection between the ground and the a n+ source diffusion 232 of the FODEnMOS 401 and the gate 410.

Although the present invention has been described with reference to several embodiments, various changes and modifications may be suggested to one skilled in the art. It is intended that the present invention encompass such changes and modifications as fall within the scope of the appended claims.

What is claimed is:

1. A high voltage ESD protection device comprising:
    a drain extended MOS transistor located in a tank region of a first conductivity type, said drain extended MOS transistor including:
        a first well region of a second conductivity type located in said tank region,
        a drain contact of said second conductivity type located in said first well region,
        a source of said second conductivity type located in said tank region,
        a field oxide region in said tank region separating said source from said first well region, and
        a gate extending over said field oxide region and being electrically coupled to said source;
    a silicon controlled rectifier coupled to said drain contact extended MOS transistor in said tank region, said silicon controlled rectifier including:
        a second well region of said second conductivity type located in said tank region,
        a pad, and
        an anode region of the first conductivity type located in said second well region, said anode region being electrically coupled to said pad;
    a resistor merged with said drain extended MOS in said tank region, said resistor including:
        a third well region of said second conductivity type located in said tank region,
        a first resistor diffusion region electrically coupled to said drain contact, and
        a second resistor diffusion region electrically coupled to said pad.

2. The device of claim 1, wherein said first conductivity type is p-type and said second conductivity type is n-type.

3. The device of claim 1, wherein said first conductivity type is n-type and said second conductivity type is p-type.

4. The device of claim 1, further comprising a SCR diffusion region of the same conductivity type as said second well region, said diffusion region being located within said second well region to provide latchup immunity, and said diffusion region being electrically connected to the anode.

5. The device of claim 1, further comprising an epitaxial layer, wherein the tank region is located in the epitaxial layer, said epitaxial layer including a low resistance region having a thickness F, and wherein a spacing D between the edge of the second well region and the source is twice as large as the thickness F.

6. The device of claim 1, wherein said gate is connected to a ground potential.

7. The device of claim 1, wherein said first and second well regions are high voltage well regions.

8. The device of claim 1 wherein said first well region is a high voltage well region and said second well region is a low voltage well region.

9. A high voltage ESD protection device comprising:
    a drain extended MOS transistor located in a tank region of a first conductivity type, said drain extended MOS transistor including:
        a first well region of a second conductivity type located in said tank region,
        a drain contact of said second conductivity type located in said first well region,
        a source of said second conductivity type located in said tank region,
        a field oxide region in said tank region separating said source from said first well region, and
        a gate extending over said field oxide region and being electrically coupled to said source;
    a silicon controlled rectifier coupled to said drain contact extended MOS transistor in said tank region, said silicon controlled rectifier including:
        a second well region of said second conductivity type located in said tank region,
        a pad, and
        an anode region of the first conductivity type located in said second well region, said anode region being electrically coupled to said pad;
    a resistor merged with said drain extended MOS in said tank region, said resistor including:
        a third well region of said second conductivity type located in said tank region,
        a first resistor diffusion region electrically coupled to said drain contact, and
        a second resistor diffusion region electrically coupled to said pad; and
    a channel region located between said source and said field oxide region, wherein the gate is partially located over the channel region.

10. The device of claim 9, wherein said first conductivity type is p-type and said second conductivity type is n-type.

11. The device of claim 9, wherein said first conductivity type is n-type and said second conductivity type is p-type.

12. The device of claim 9, further comprising a SCR diffusion region of the same conductivity type as said second well region, said diffusion region being located within said second well region to provide latchup immunity, and said diffusion region being electrically connected to the anode.

13. The device of claim 9, further comprising an epitaxial layer, wherein the tank region is located in the epitaxial layer, said epitaxial layer including a low resistance region having a thickness F, and wherein a spacing D between the edge of the second well region and the source is twice as large as the thickness F.

14. The device of claim 9, wherein said gate is connected to a ground potential.

15. The device of claim 9, wherein said first and second well regions are high voltage well regions.

16. The device of claim 9 wherein said first well region is a high voltage well region and said second well region is a low voltage well region.

* * * * *